United States Patent [19]
Lin et al.

[11] Patent Number: 5,724,657
[45] Date of Patent: Mar. 3, 1998

[54] ADAPTIVE FREQUENCY CORRECTION BURST DETECTOR FOR GSM HANDSET SYSTEM

[75] Inventors: Jingdong Lin, Irvine; Ker Zhang, Newport Beach, both of Calif.

[73] Assignee: Rockwell International Corporation, Newport Beach, Calif.

[21] Appl. No.: 537,376

[22] Filed: Sep. 29, 1995

[51] Int. Cl.$^6$ ................................................ H04B 17/00
[52] U.S. Cl. ................... 455/423; 455/67.1; 455/226.1; 455/226.4; 375/343; 375/350
[58] Field of Search .................... 455/33.1, 54.1, 455/56.1, 63, 67.1, 67.7, 226.1, 226.2, 226.3, 226.4, 229, 303, 304, 305, 306, 307, 422, 423, 425; 375/254, 285, 343, 347, 350, 349

[56] References Cited

U.S. PATENT DOCUMENTS

| | | | |
|---|---|---|---|
| 4,038,540 | 7/1977 | Roberts | 455/305 |
| 4,088,833 | 5/1978 | Godard et al. | 375/350 |
| 5,422,912 | 6/1995 | Asser et al. | 375/350 |
| 5,465,405 | 11/1995 | Baseghi et al. | 455/226.4 |

*Primary Examiner*—Reinhard J. Eisenzopf
*Assistant Examiner*—Thanh Le
*Attorney, Agent, or Firm*—William C. Cray; Philip K. Yu

[57] ABSTRACT

An adaptive frequency correction burst detector for GSM handset systems in a wireless communication system is disclosed. The detector uses a bandpass filter to filter the complex received samples to generate a first filtered output r(n). The first filtered output is then applied to a notch filter for the notch filter to adaptively generate a second filtered output y(n). An error calculation unit is used for calculating an error signal based on the difference between the second filtered output y(n) and a desired signal d(n), which is zero in the case of a notch filter. A notch filter coefficient updating unit is used for adaptively updating the notch filter using a least-mean-square algorithm. Then an error power is estimated based on the second filtered output y(n), while the signal power is estimated based on the first filtered output r(n). The power ratio between the two power estimates is compared to a predetermined threshold and if the ratio is below the threshold for a predetermined duration, then the system has detected the FCB signal.

15 Claims, 3 Drawing Sheets

5,724,657

ADAPTIVE FREQUENCY CORRECTION BURST DETECTOR FOR GSM HANDSET SYSTEM

FIELD OF INVENTION

The present invention relates to signal detection in wireless communication systems and more specifically to signal detection in a cellular or mobile communication systems using adaptive Frequency Correction Burst detectors.

BACKGROUND OF INVENTION

Wireless communication, particularly cellular communication such as GSM ("the Global System for Mobile communications") or NADC ("North American Digital Cellular Systems"), has become a necessary, if not essential, part of the technology revolution. It has allowed a user to place and receive telephone calls at anywhere and any place through her mobile cellular phone or cordless phone (hereinafter "phone"), irrespective of whether she is in a moving automobile slowly making her way through a traffic jam or in an office building attending a meeting. As long as the user is within a "cell" which is served by a base station, she is always one phone call away from her friends, colleagues or business associates.

What is supposed to be transparent to the user, e.g. the seamless connection and accessibility enjoyed by the user, is always quite problematic and challenging to the engineers and technologists Working behind the scene. As the user moves through various cell zones, her phone must constantly perform a few tasks. First, the phone should be able to establish connection, through a handshake phase, with the base station of the serving cell within which the phone is located. Another task is for the phone, after the connection is already established, to monitor the carrier frequencies of the neighboring cells. FIG. 1 illustrates the relationship between the "serving cell" and the "neighboring cells."

In the GSM specification, the carrier frequency of a mobile station is required to synchronized to that of the base station with which the connection will be established. During the handshake phase of a mobile cellular handset system, such as GSM or NADC, an FCB detector is required to detect the FCB transmitted by a base station for establishing connection. In a typical TDMA cellular system, the FCB is a single tone with a nominal frequency within a given frequency range, and repeats every 50 bursts. However, factors such as strong Gaussian noise, strong co-channel and adjacent channel interference, and severe fading, have made a typical multi-band filtering method quite unreliable and time-consuming. The net effect from the users' perspective thus becomes long establishing periods, as the users move from cell to cell.

Therefore, there is a need for a more efficient and reliable FCB detector in the cellular handset for establishing connection in a wireless environment.

SUMMARY OF THE PRESENT INVENTION

An adaptive frequency correction burst detector for GSM handset systems in a wireless communication system is disclosed. The detector uses a bandpass filter to filter the complex received samples to generate a first filtered output r(n). The first filtered output is then applied to a notch filter for the notch filter to adaptively generate a second filtered output y(n). An error calculation unit is used for calculating an error signal based on the difference between the second filtered output y(n) and a desired signal d(n), which is zero in the case of a notch filter. A notch filter coefficient updating unit is used for adaptively updating the notch filter using a least-mean-square algorithm. Then an error power is estimated based on the second filtered output y(n), while the signal power is estimated based on the first filtered output r(n). The power ratio between the two power estimates is compared to a predetermined threshold and if the ratio is below the threshold for a predetermined duration, then the system has detected the FCB signal.

BRIEF DESCRIPTION OF THE DRAWING

Additional objects, features and advantages of the present invention will become apparent to those skilled in the art from the following detailed description, wherein.

DETAILED DESCRIPTION OF A PREFERRED EMBODIMENT

The present invention provides a reliable and efficient FCB detector in a wireless environment with strong Gaussian noise, co-channel and adjacent channel interference and fast channel fading. The conventional tone detection method, such as multi-band filtering, has proven to be quite unreliable due to the strong interferences in the environment, as well as the indeterminate tone frequency. Instead, the present invention employs an adaptive filtering method to adaptively notch out the tone within the received FCB signal, even in the presence of strong interferences.

In the following description, the present invention is described in terms of algorithms and functional block diagrams, which are the usual means for those skilled in the art to communicate with others similarly skilled in the art. It should be appreciated by those skilled in the art that the present invention is not strictly limited to its symbolic representations herein and those skilled in the art can readily modify the illustrated embodiment to implement the present invention for their particular applications.

Figure 1:
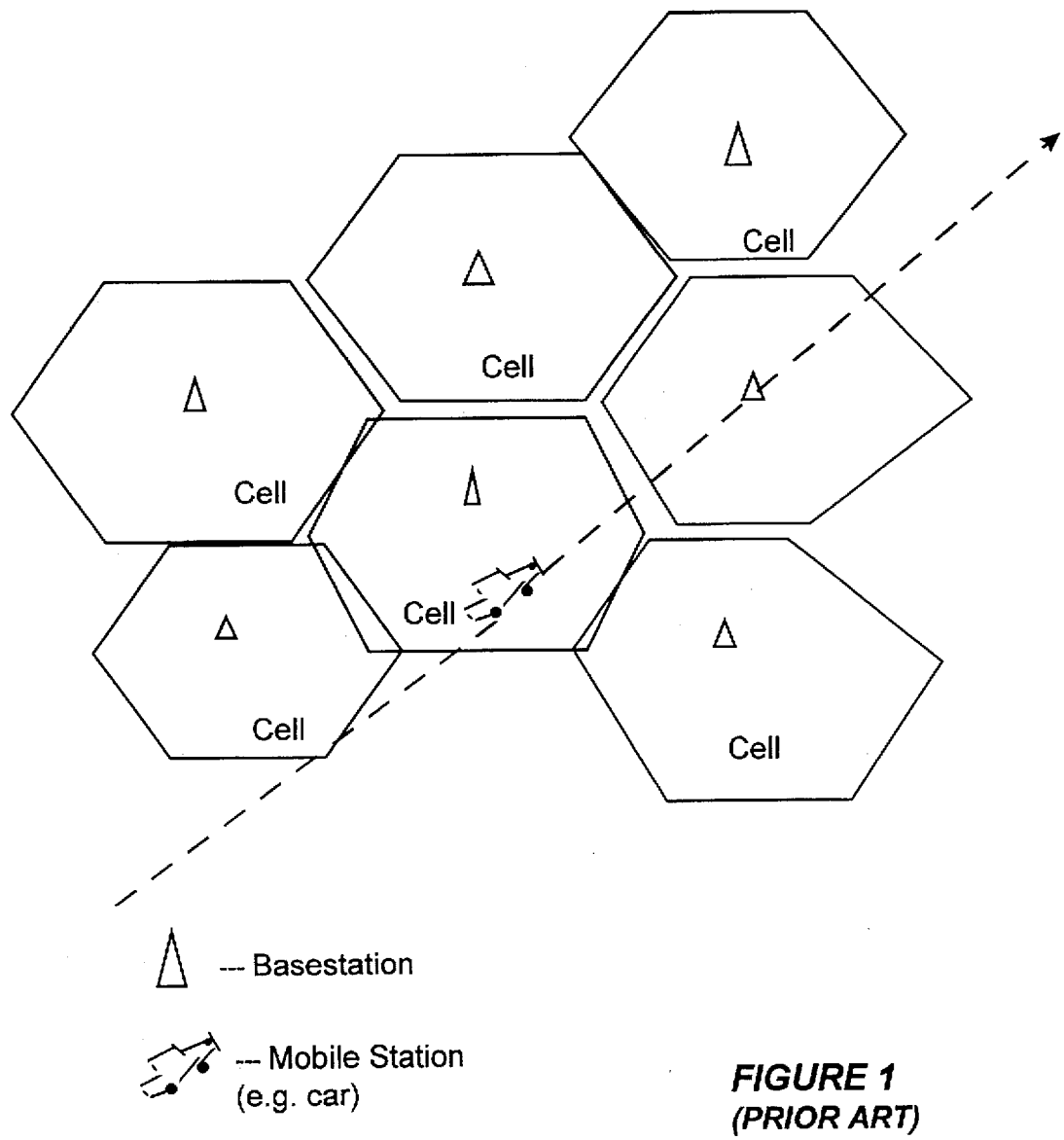
FIG. 1 illustrates a typical cellular communication network.
Figure 2:
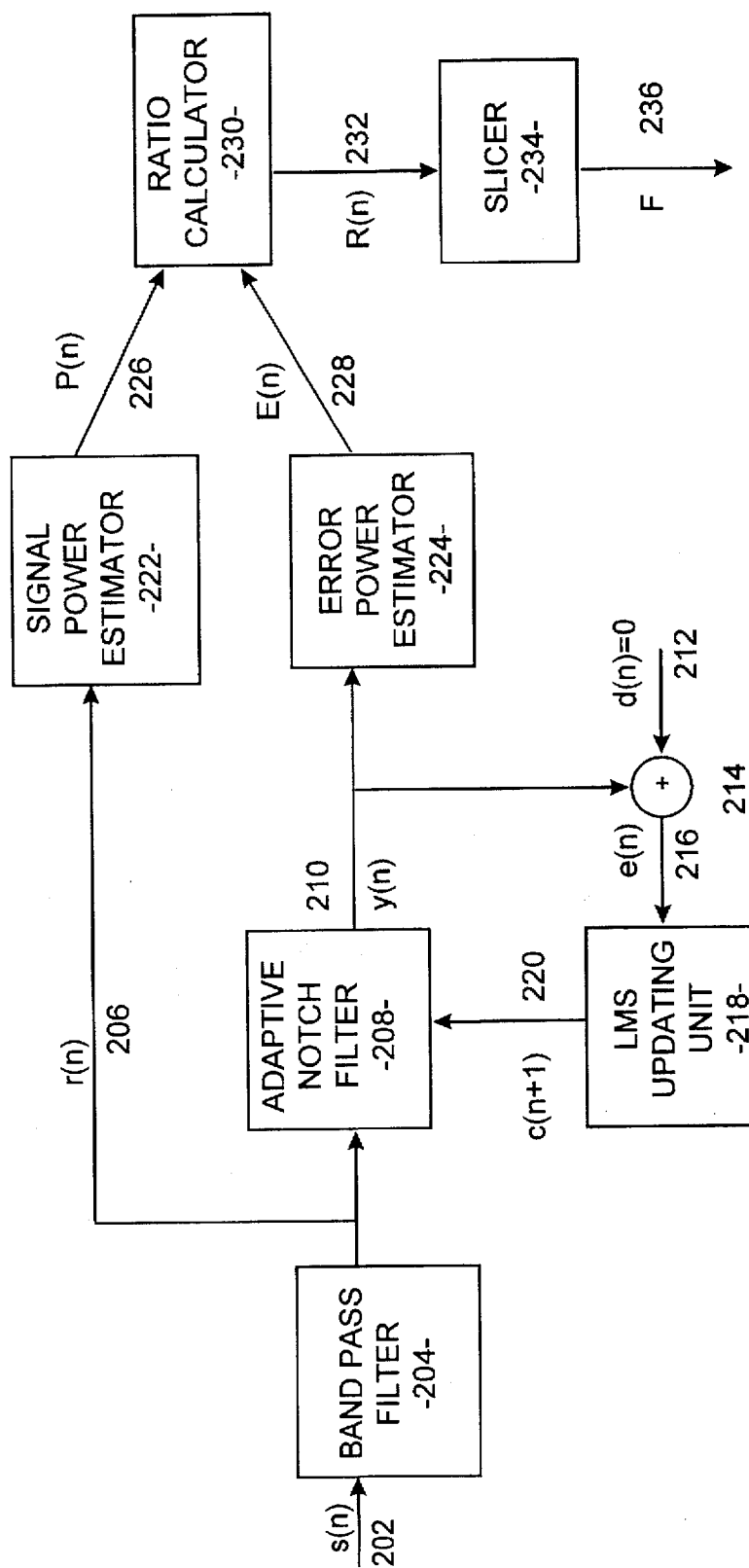
FIG. 2 illustrates the system block diagram of an adaptive FCB detector in accordance with the present invention.

Reference is to FIG. 2, where a system block diagram of an adaptive FCB detector for detecting the FCB sent by a base station is shown. After being received by the handset, the baud rate sampled signal s(n) (202) is first filtered by a Butterworth bandpass filter (204) to reject any noise and out-bound interference. The bandpass filter is currently designed to have a passband from 32 KHz to 103 KHz.

Note that the signal s(n) is typically a demodulated complex signal, i.e. with both real and imaginary parts. Also, the bandpass filter 104 may be a second-order, an eighth-order filter, or a variety of bandpass filters as will be appreciated by those skilled in the art.

The filtered signal r(n) (206), either the real part or the imaginary part of the filtered signal from the bandpass filter 202, is applied to two units. One is an adaptive notch filter (208) for notching out the tone of the signal. The other is a signal power estimator (222) for forming the signal power P(n) (226).

The notch filter 208 has the following transfer function:

$$H(z) = \frac{1 + c(n)z^{-1} + z^{-1}}{1 + c(n)\lambda z^{-1} + \lambda^2 z^{-2}}.$$

Note that the notch filter 208 may be an IIR type with two symmetric poles and two symmetric zeros. The pole and the zero on the same side of the x-axis are located on the same radius. The zeros are on the unit circle and the poles are within and near the unit circle. The zeros and poles are adaptively adjusted to match the frequency of the received signal by one adaptive parameter. If the FCB signal is a single tone, its power will be completely notched out by the frequency null of the filter.

The notch filter output signal (210) thus becomes:

$$y(n)=r(n)+c(n)\cdot r(n-1)+r(n-2)-\lambda\cdot c(n)\cdot y(n-1)-\lambda^2\cdot y(n-2).$$

The output signal y(n) of the notch filter 208 is compared (214) with a desired signal (212), which is zero in the case of a notch filter, to form an error signal e(n) (216), which is represented by:

$$e(n)=d(n)-y(n)=-y(n), \text{ where } d(n)=0.$$

The error signal e(n) (216) is used by a least mean square ("LMS") coefficient updating unit (218) to update the notch filter coefficient c(n) (220), which can be calculated as:

$$c(n+1)=c(n)+w\cdot sign\{e(n)\cdot[r(n-1)+\lambda\cdot e(n-1)]\},$$

where "w" is the "step" and sign(x) is 1 if x>0, is −1 if x<0.

On the other hand, the notch filter output signal y(n) (210) is applied to an error power estimator (224) to form an error power E(n) (128), which can be calculated as:

$$E(n+1)=g\cdot E(n)+(1-g)\cdot e^2(n),$$

where "g" is the "forgetting factor." The signal power P(n) is also calculated by a signal power estimator (222) as:

$$P(n+1)=g\cdot P(n)+(1-g)\cdot r^2(n).$$

Then, a ratio of the error power E(n) to the signal power P(n) is calculated by a ratio calculator (230) as:

$$R(n) = \frac{E(n)}{P(n)},$$

and the result (232) is compared to a pre-determined threshold (234). If the ratio is continuously lower than the threshold for a pre-determined time, a signal (236) is set to alert that an FCB signal has been detected.

Figure 3:
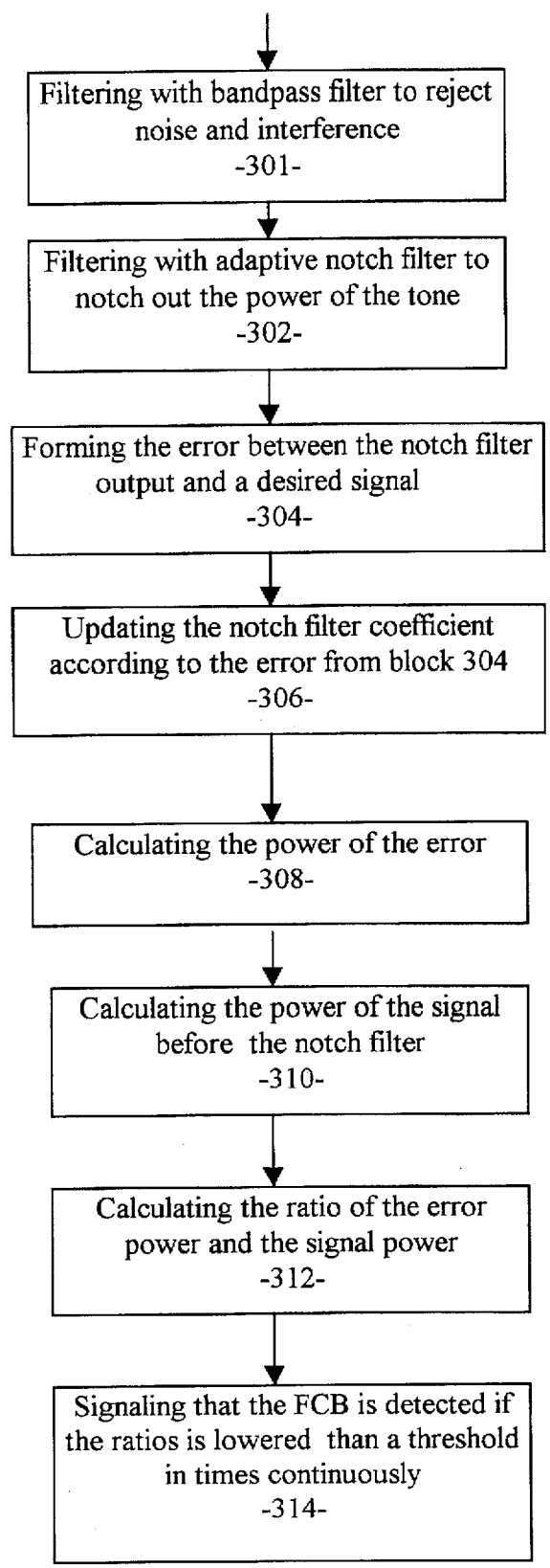
FIG. 3 is a flow chart showing the steps performed by an adaptive FCB detector in accordance with the present invention.

Reference is to FIG. 3, where a flow chart 300 of an adaptive FCB detector in accordance with the present invention is shown. For each sampled data s(n) received at baud rate, it is filtered by a bandpass filter, such as a Butterworth filter, to reject noise and interference (301). Then, the filtered signal is filtered by an adaptive notch filter for notching out the power of the tone (302), producing the signal y(n). Note that the notch filter may be a 2-pole or 8-pole notch filter, as will be understood by those skilled in the art.

After that, an error signal e(n) is formed by subtracting the notch filter output y(n) from the desired signal d(n) (304), which is 0 in the case of a notch filter. The notch filter coefficient c(n+1) is then updated according to the error signal e(n) (306). The updating methodology may be based on Least Mean Square or any adaptive algorithm.

Then, the power of the error, E(n), and the power of the sampled signal before the notch filter, P(n), are calculated separately (308 and 310). The ratio R(n) of two powers are calculated (312) and compared with a pre-determined threshold. If the ratio is continuously lower than the threshold for a pre-determined duration, the detection of FCB is declared (314).

In an exemplary implementation, the present invention may be utilized in a GSM handset. The single tone in the FCB burst can be anywhere between 37.7 KHz to 97.7 KHz, while the carrier frequency is at 900 MHz and sampling rate at 270 KHz. An eight-order Butterworth filter with pass band from 37.7 KHz to 97.7 KHz is used to process the data (204 and 302). For the detector, five parameters have been determined based on experiments. For the LMS updating mechanism, the step is w=0.08. For power estimation, the forgetting factor is g=0.96. For the distance from a pole to the origin in the notch filter, λ, its value is set at λ=0.82. For the threshold ratio, the value is set at 0.6 and the pre-determined duration is 6 sample intervals. The performance of such a system is that its detection rate has been consistently over 96%, while the missing rate has been consistently below 2%.

We claim:

1. A method of detecting a single tone signal within a wireless transmission in a telecommunication system, said telecommunication system comprising at least one base station and at least one mobile station, said base station broadcasting said wireless transmission for said mobile station to receive, said single tone signal having a nominal frequency within a predetermined frequency range, said mobile station receiving said wireless transmission to generate complex input samples, s(n), said method comprising the steps of:

(a) bandpass filtering said complex input samples, s(n), to generate a first filtered output r(n);

(b) filtering said first filtered output r(n) with an adaptive notch filter to generate a second filtered output, y(n);

(c) comparing said second filtered output with a predetermined signal, d(n), to form an error signal e(n), wherein, e(n)=d(n)−y(n);

(d) updating said adaptive notch filter based on said error signal to generate an updated second filtered output, y(n);

(e) estimating a power of said updated second filtered output;

(f) estimating a power of said first filtered output r(n);

(g) forming a ratio of said powers from said updated second filtered output and said first filtered output;

(h) comparing said ratio with a predetermined threshold and if said ratio is continuously lower than said predetermined threshold for a predetermined duration, declaring said single tone signal is detected.

2. A method of detecting a frequency correction burst ("FCB") signal from within a wireless transmission in a telecommunication system, said FCB comprising a single tone signal having a nominal frequency within a predetermined frequency range, said wireless transmission being sent from a base station to be received and sampled by a mobile station, said mobile station generating complex input samples s(n) after receiving said wireless transmission, comprising the steps of:

(a) bandpass filtering said complex input samples s(n) to generate a first filtered output r(n);

(b) filtering said first filtered output r(n) with an adaptive notch filter to generate a second filtered output, y(n);

(c) forming an error signal e(n) between said second filtered output y(n) from said adaptive notch filter and a predetermined signal d(n), wherein e(n)=d(n)−y(n);

(d) continuously updating said adaptive notch filter using an adaptive algorithm based on said error signal e(n), said adaptive notch filter thus generating an updated second filtered output;

(e) continuously calculating a power estimate E(n) of said second filtered output y(n) from said adaptive notch filter;

(f) calculating a power estimate P(n) of said first filtered output from the Step of bandpass filtering;

(g) forming ratio of said power estimates;

(h) comparing said ratio with a predetermined threshold, and if said ratio is below said threshold for a predetermined duration, declaring that said FCB is detected.

3. A method according to claim 2, wherein:
said predetermined signal d(n) in said step (c) is set at 0.

4. A method according to claim 3, wherein said second filtered output y(n) of said adaptive notch filter in said step (b) is represented as follows:

$$y(n)=r(n)+c(n)\cdot r(n-1)+r(n-2)-\lambda \cdot c(n)\cdot y(n-1)-\lambda^2\cdot y(n-2),$$

where r(n) is said first filtered output, c(n) is an adaptive notch filter coefficient, $\lambda$ is predetermined value, and n is an index of samples in said wireless transmission.

5. A method according to claim 2, wherein said second filtered output y(n) of said adaptive notch filter in said step (b) is represented as follows:

$$y(n)=r(n)+c(n)\cdot r(n-1)+r(n-2)-\lambda \cdot c(n)\cdot y(n-1)-\lambda^2\cdot y(n-2),$$

where r(n) is said first filtered output, c(n) is an adaptive notch filter coefficient, $\lambda$ is predetermined value, and n is an index of samples in said wireless transmission.

6. A method according to claim 5, where said step (d) of updating c(n) based on said error signal is represented as follows:

$$c(n+1)=c(n)+w\cdot sign\{e(n)\cdot [r(n-1)+\lambda \cdot e(n-1)]\},$$

where w is a predetermined step size and sign(x) is 1 if x>0, is −1 if x<0.

7. A method according to claim 5, wherein said steps (e) and (f) are respectively represented as:

$$E(n+1)=g\cdot E(n)+(1-g)\cdot e^2(n),\ P(n+1)=g\cdot P(n)+(1-g)\cdot r^2(n),$$

where g is a predetermined constant.

8. A method according to claim 2, where said step (d) of updating c(n) based on said error signal is represented as follows:

$$c(n+1)=c(n)+w\cdot sign\{e(n)\cdot [r(n-1)+\lambda \cdot e(n-1)]\},$$

where w is a predetermined step size and sign(x) is 1 if x>0, is −1 if x<0.

9. A method according to claim 8, wherein said steps (e) and (f) are respectively represented as:

$$E(n+1)=g\cdot E(n)+(1-g)\cdot e^2(n),\ P(n+1)=g\cdot P(n)+(1-g)\cdot r^2(n),$$

where g is a predetermined constant.

10. A method according to claim 2, wherein said steps (e) and (f) are respectively represented as:

$$E(n+1)=g\cdot E(n)+(1-g)\cdot e^2(n),\ P(n+1)=g\cdot P(n)+(1-g)\cdot r^2(n),$$

where g is a predetermined constant.

11. A detector for a frequency correction burst ("FCB") signal from within a wireless transmission in a telecommunication system, said FCB comprising a single tone signal having a nominal frequency within a predetermined frequency range, said wireless transmission being sent from a base station to be received and sampled by a mobile station, said mobile station generating complex input samples s(n) after receiving said wireless transmission, comprising:

bandpass filtering means for filtering said complex input samples s(n) to generate a first filtered output r(n);

notch filtering means coupled to said bandpass filtering means for adaptively generating a second filtered output y(n);

error calculation means coupled to said notch filtering means for calculating an error signal based on a difference between said second filtered output y(n) and a predetermined signal d(n);

notch filter coefficient updating means coupled to said error calculating means and said notch filtering means for adaptively updating said notch filtering means;

error power estimate means coupled to said notch filtering means for generating an error power estimate of said second filtered output y(n);

signal power estimate means coupled to said bandpass filtering means for generating a signal power estimate of said first filtered output r(n);

ratio means coupled to said error power estimate means and said signal power estimate means for generating a ratio of said error power estimate to said signal power estimate, and compare means coupled to said ratio means for comparing said ratio with a predetermined threshold from said ratio means and if below said threshold for a predetermined duration, then declaring an FCB detection.

12. A detector according to claim 11, wherein said notch filtering means comprises an adaptive notch filter for generating said y(n), wherein:

$$y(n)=r(n)+c(n)\cdot r(n-1)+r(n-2)-\lambda \cdot c(n)\cdot y(n-1)-\lambda^2\cdot y(n-2),$$

where r(n) is said first filtered output, c(n) is an adaptive notch filter coefficient, $\lambda$ is predetermined value, and n is an index of samples in said wireless transmission.

13. A detector according to claim 12, wherein said notch filter coefficient means updates said adaptive notch coefficient, c(n), according to an LMS algorithm as follows:

$$c(n+1)=c(n)+w\cdot sign\{e(n)\cdot [r(n-1)+\lambda \cdot e(n-1)]\},$$

where w is a predetermined step size and sign (x) is 1 if x>0, is −1 if x<0.

14. A detector according to claim 13, wherein said error power estimate means and said signal power estimate means have the following expressions, respectively:

$$E(n+1)=g\cdot E(n)+(1-g)\cdot e^2(n),\ P(n+1)=g\cdot P(n)+(1-g)\cdot r^2(n),$$

where g is a predetermined constant.

15. A detector according to claim 12, wherein said error power estimate means and said signal power estimate means have the following expressions, respectively:

$$E(n+1)=g\cdot E(n)+(1-g)\cdot e^2(n),\ P(n+1)=g\cdot P(n)+(1-g)\cdot r^2(n),$$

where g is a predetermined constant.

* * * * *